(12) United States Patent
Hakala et al.

(10) Patent No.: US 6,677,819 B1
(45) Date of Patent: Jan. 13, 2004

(54) POWER AMPLIFIER UNIT

(75) Inventors: Timo Hakala, Espoo (FI); Ossi Pollanen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/936,539
(22) PCT Filed: Mar. 12, 1999
(86) PCT No.: PCT/EP99/01633
§ 371 (c)(1), (2), (4) Date: Jan. 16, 2002
(87) PCT Pub. No.: WO00/55968
PCT Pub. Date: Sep. 21, 2000

(51) Int. Cl.$^7$ ................................................. H03G 3/20
(52) U.S. Cl. ..................................................... 330/136
(58) Field of Search ........................... 330/2, 136, 140, 330/285; 455/126

(56) References Cited

U.S. PATENT DOCUMENTS

| | | | |
|---|---|---|---|
| 5,311,143 A | | 5/1994 | Soliday ........................ 330/127 |
| 5,430,410 A | | 7/1995 | Raynaud et al. ............. 330/279 |
| 5,936,464 A | * | 8/1999 | Grondahl ................. 330/136 X |
| 6,107,880 A | * | 8/2000 | Shaw ........................... 330/136 |
| 6,118,988 A | * | 9/2000 | Choi ........................... 455/115 |

OTHER PUBLICATIONS

Patent Abstracts of Japan: vol. 1996, No. 4, Apr. 30, 1996 & JP 07 336243 A, Matsushita Electric Ind Co Ltd, Dec. 22, 1995.

* cited by examiner

Primary Examiner—Steven J. Mottola

(57) ABSTRACT

A power amplifier unit for a transmitter in a mobile communication system is set up so that the operational point of the power amplifier varies in dependence on the instant power level of its input signal. This is used in the context of a variable envelope input signal such that a constant gain of the power amplifier can be achieved by this feedback.

9 Claims, 3 Drawing Sheets

POWER AMPLIFIER UNIT

The present invention relates to a power amplifier unit and particularly but not exclusively to a power amplifier unit for use in a transmitter for a mobile communications system.

The present invention is concerned with power amplifiers, particularly linearised power amplifiers, that is amplifiers which do not generate distortion products and thus produce output signals containing only the spectral components of the input signal. Outside the input signal spectrum, signals should be attenuated as far as possible. Such amplifiers are used particularly in mobile communication networks, where transmission systems operate with in designated frequency bands which are termed herein transmission bands or communication bands. For example, according to one mobile communication standard, transmission channels each having a band width of 5 MHz may lie within a communication band of 2.11 GHz to 2.17 GHz, that is having an overall frequency width of 60 MHz. Thus, the power amplifier which amplifies these transmission channels prior to transmission via an RF antenna is effective if it amplifies signals in this frequency range, but attenuates signals outside that frequency range.

Generally, linearised power amplifiers have gain characteristics which are dependent on input and output power levels. With constant envelope input signals, such as GMSK used in GSM, it is possible to set the power amplifier to an optimum operational point and to leave it at that point. However, for variable envelope input signals such as wide band CDMA (W-CDMA) or multi-carrier GSM, if the power amplifier is set to a fixed operational point, this will be optimum only for a small proportion of the input signal. Thus, for most of the input signal the power amplifier will be operating with a lower efficiency and linearity than it is capable of delivering at its optimum operational point.

It is an aim of the present invention to improve the operational characteristics of a power amplifier unit.

According to one aspect of the invention there is provided a power amplifier unit comprising: power amplifier means having an input arranged to receive a variable envelope input signal and circuitry for setting an operational point of the power amplifier means; means for detecting the instant input level of the input variable envelope signal to generate a power level information signal; and means for using the power level information signal to control the setting circuitry such that the operational point of the power amplifier varies in dependence on the instant power level of the variable envelope input signal to maintain a constant gain of the power amplifier.

The power amplifier means can be constituted by a power amplifier which includes setting circuitry in the form of gating circuitry such as an FET responsive to a bias control voltage. In that case, the power level information signal is used to generate a bias control signal for controlling the gating circuitry of the power amplifier to set its operational point.

The means for using the power level information signal can comprise a look-up table which holds for a plurality of power levels respective digital control settings. A digital to analogue converter can be provided to convert the digital control settings to an analogue bias control signal for controlling the gating circuitry.

Alternatively or additionally, the power amplifier means can include a power amplifier connected to receive a preamplified signal from a preamplifier which is connected itself to receive the variable envelope input signal. The preamplifier can be controlled by a digital control setting directly from the look-up table or by an analogue signal generated by the digital to analogue converter when present. The power level of the output signal from the preamplifier is thus attenuated according to the instant input level of the input variable envelope signal. This allows the power amplifier itself to operate within its correct operational range. Thus, in this sense the preamplifier acts as setting circuitry for setting the operational point of the power amplifier.

According to another aspect of the invention there is provided a transmission system for a mobile communications network comprising: means for generating an information signal representing data to be transmitted via the mobile communications network; a mixer for combining said information signal with a carrier signal to generate a combined signal for transmission purposes, said combined signal having a variable power envelope; a power amplifier for amplifying said combined signal to a power level adequate for transmission via an RF antenna; and means for setting the operational point of the power amplifier responsive to the instant input power level of the variable envelope input signal such as to maintain a constant gain for the power amplifier.

For a better understanding of the present invention and to show how the same may be carried into effect reference will now be made by way of example to the accompanying drawings in which:

FIG. 1 illustrates a transmission system 1 for an RF communications network such as that for a mobile telephone network. Such a transmission system may be utilised for example at a base station for the communications network or within mobile stations communicating with the base station.

Figure 1:
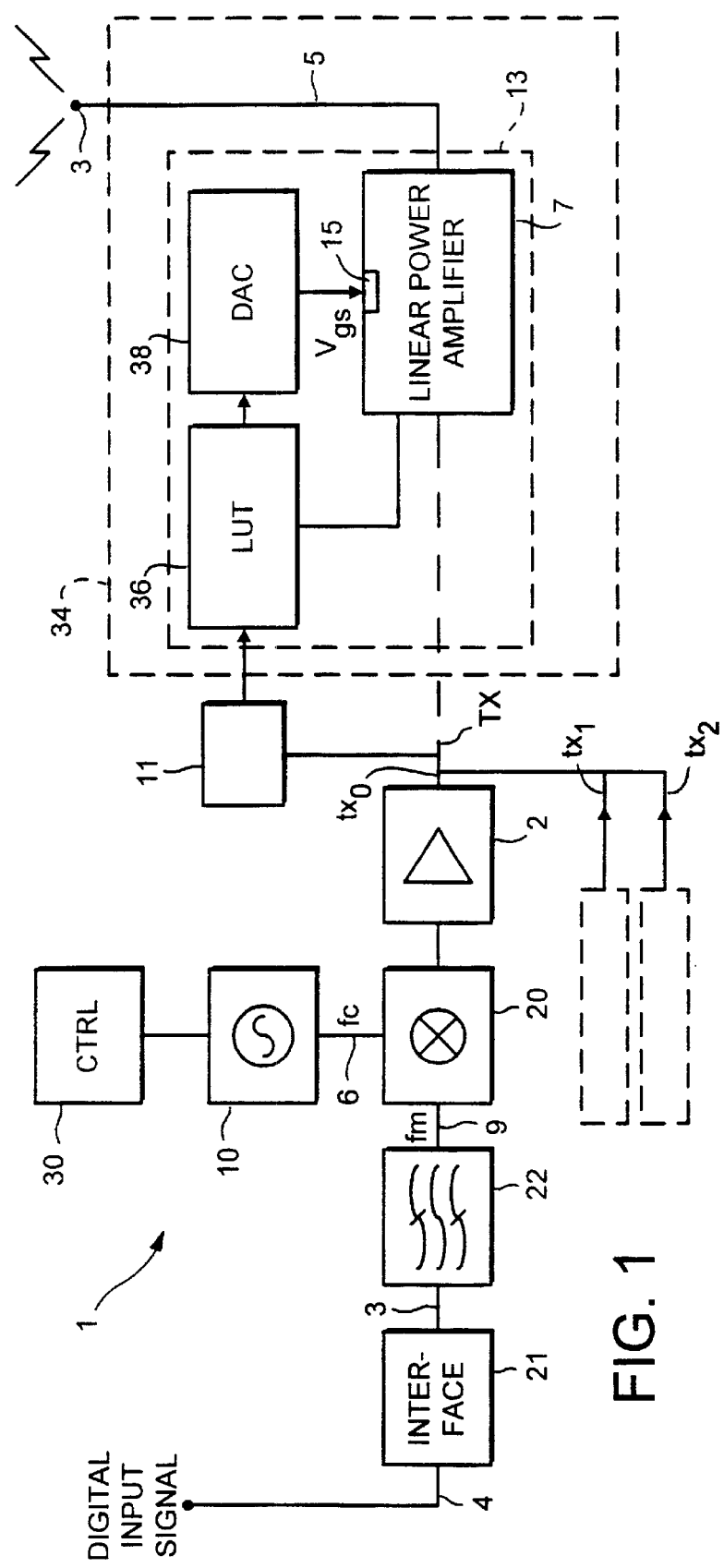
FIG. 1 illustrates a transmission system in a mobile communications network.

An input signal 4, in digital format, is supplied to the system from a data generator (not shown). The input signal may contain voice information or any other such information which is required to be transmitted. The input signal is fed into an interface unit 21 which performs the necessary encoding, modulation etc. to generate an information signal 3. The precise details depend on the nature of the communication system. As an example, in a WBCDMA system, for each communication channel a spreading code is used to generate an information signal 3 of bandwidth around 5 MHz. The details of WBCDMA are known and are not discussed further herein.

The information signal 3 is passed through a bandpass filter 22. The filtered signal 9 at a modulation frequency fm is supplied to a mixer 20.

A local oscillator 10 generates a carrier signal 6 at a carrier frequency fc which is fed into the mixer 20. The carrier frequency fc is selectable by a controller 30 within a transmission band which in this example lies between 2.11 GHz ($f_2$) and 2.17 GHz ($f_3$). The information signal and the carrier signal are mixed and output as a transmission signal $tx_0$. The transmission signal thus comprises the carrier signal 6 modulated by the filtered signal 9. A number of communication channels can be transmitting simultaneously signals $tx_1$, $tx_2$ etc each spread their unique spreading code. These are transmitted as a single signal TX. That signal TX thus comprises a number of different calls all overlapping which can be separated at a decoder by despreading using the spreading code. The power level of the signal TX at any point represents the total power of all the calls. Thus, the power level variation with time is unpredictable (see FIG. 3).

A preamplifier 2 amplifies the transmission signal TX to a level which will enable the signal to be transmitted via land line to an antenna station 34 including an antenna 3, which may be situated distant from the base station, without the signal becoming attenuated to such an extent that it becomes undetectable. The transmission power level is detected by a power level detection circuit 11 in the baseband block of the transmission system. At the antenna station, the transmission signal is fed into a linear power amplifier unit 13 and is again amplified to levels which permit it to be transmitted as electromagnetic radiation at an RF frequency over large distances. The linear power amplifier unit comprises a linear power amplifier 7, a look-up table (LU) 36 and a bias control unit (DAC) 38.

Once amplified to the required power levels by the linear power amplifier unit 13, the transmission signal is fed to the antenna 3 as an output signal.

As already mentioned, in a W-CDMA BTS transmitter system, the transmission signal TX comprises a plurality of channels, each spread according to their own individual spreading codes at individual power levels. Therefore the overall signal which is supplied to the antenna station 34 has a variable power envelope.

Figure 3:
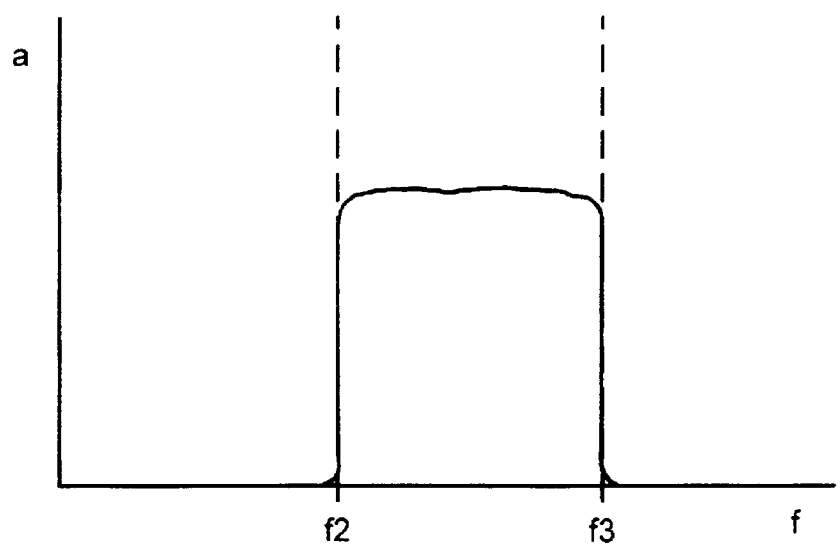
FIG. 3 illustrates an idealised output of a linear power amplifier.

FIG. 3 illustrates an "ideal" output signal which it would be desirable for the LPA unit 13 to generate for an input signal having the same frequency spectrum. Ideally, the amplifier would have constant gain at frequencies only within the desired transmission band which extends from $f_2$ to $f_3$ and zero gain at frequencies outside the transmission band. Generally speaking, the closest which can be attained to this strict linearity requirement is at only one optimum operation point of a power amplifier for a given power input level. With a constant envelope signal, it is possible to set the power amplifier to this optimum operation point. However, with a variable envelope input signal such as occurs with W-CDMA systems, the optimum operational point varies with the current input power level.

Figure 4:
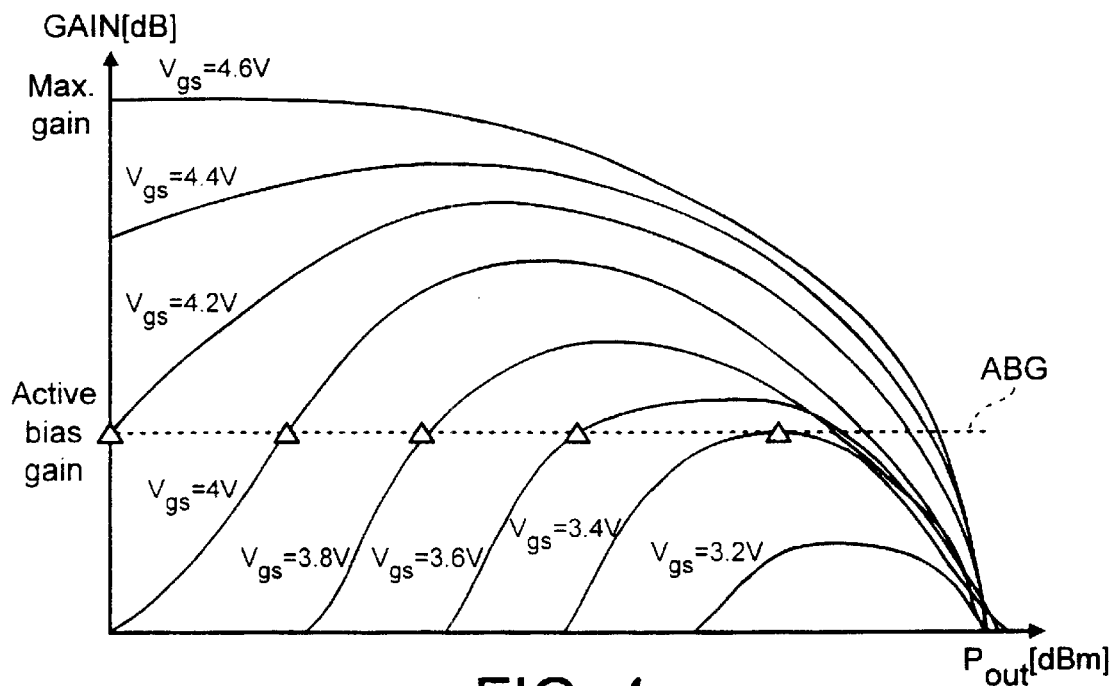
FIG. 4 is a graph of gain against output power for a typical linearised power amplifier.

The operational point of the linear power amplifier 7 is controlled by gating circuitry 15 responsive to a bias voltage $V_{gs}$. FIG. 4 shows typical gain curves of a power amplifier as function of output power. The gain curves are shown at different bias points. The idea underlying the active bias arrangement described herein is to maintain as constant a gain as possible even at high power levels. This is done at the expense of achieving a maximum gain.

Figure 2:
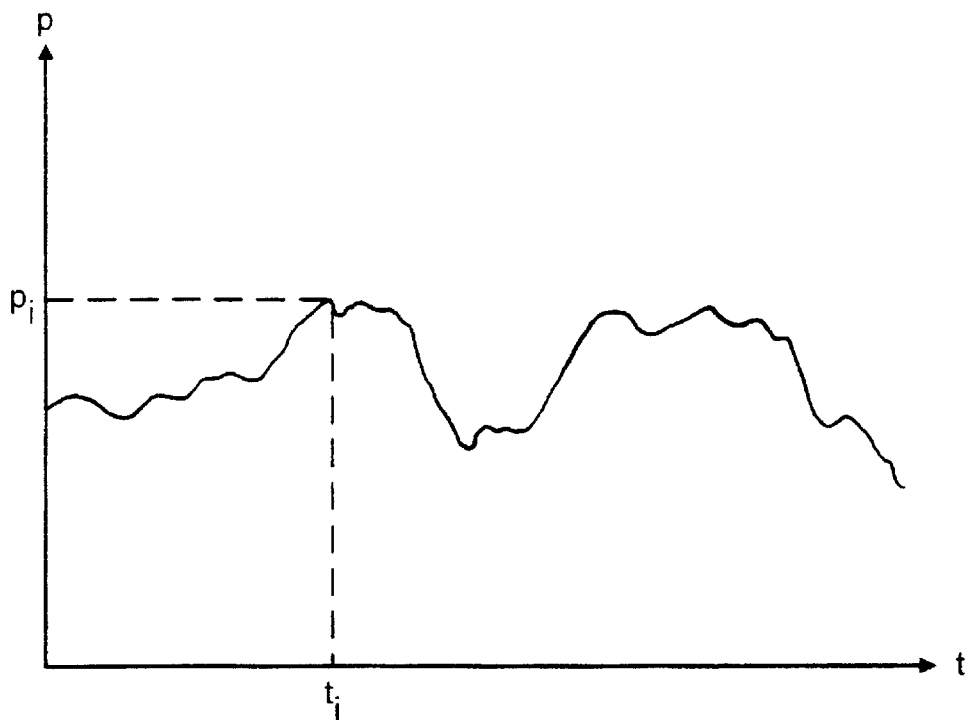
FIG. 2 illustrates a variable envelope transmission signal.

The line marked ABG in FIG. 4 represents the active bias gain which is selected as the constant gain to be maintained regardless of input power levels. This is achieved using the circuitry illustrated in the antenna station 34 of FIG. 1 as follows. The instant power level of the transmission signal TX (e.g. $p_i$ at time $t_i$ in FIG. 2) is detected by the power level detection circuit 11 in the base band block and supplied to the look-up table 36. The look-up table 36 includes a corresponding bias value for each power level of the signal and supplies a digital representation of this value to the DAC 38. The active bias control unit 38 takes the form of a digital to analogue converter which converts the digital information received from the look-up table to an analogue signal such as the bias voltage $V_{gs}$. In one example, the gating circuitry is an FET transistor, the gate of which is controlled by the bias voltage $V_{gs}$ to adjust the bias point of the power amplifier.

This has the advantage that the gain of the linear power amplifier unit can be kept constant regardless of changes in the power level of the input signal TX. This improves the linearity characteristics and efficiency of the power amplifier.

The active bias control mechanism can be used in conjunction with methods for improving the linearity of the power amplifier, such as predistortion feed forward or other linearisation methods.

It is noted that since the active bias adjustment takes place at the frequency of the signal (for example 5 MHz in the WCDMA system), the correction should be as fast as the envelope of the transmitted signal. An important factor in achieving this is selection of the digital to analogue converter 38 which supplies the analogue information VGF obtained in digital format from the look-up table 36.

Figure 5:
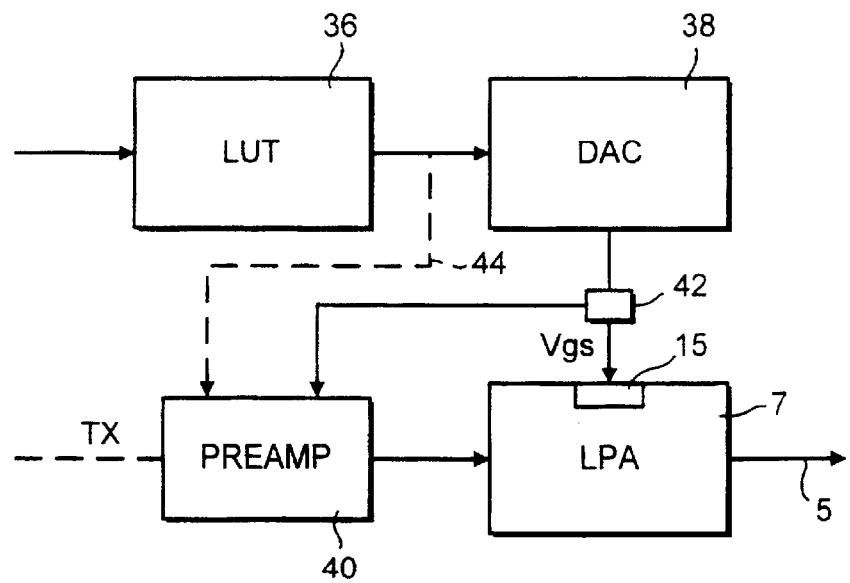
FIG. 5 is a sketch illustrating in a single diagram a number of different possible arrangements for the power amplifier unit.

As described above, the digital to analogue converter can adjust the operational point of an FET transistor. An alternative arrangement is possible as illustrated in FIG. 5. FIG. 5 shows a switch 42 which can selectively connect the output of the digital to analogue converter 38 to a preamplifier 40 which is connected upstream of the linear power amplifier 7. The signal from the digital to analogue converter can thus adjust the gain or attenuation of the preamplifier. A further possibility is to remove the digital to analogue converter 38 entirely and to use the digital control signal generated from the look-up table 36 to directly control a numerical preamplifier as indicated by the dotted line 44 in FIG. 5. Thus, in that case the look-up table 36 will control the amplifier 40 directly and digitally.

An additional digital to analogue converter could be included in the circuit to control the phase of the signal. This may be desirable if the am-pm behaviour of the power amplifier is too far away from the ideal.

In addition it would be possible to implement feedback within the circuitry to allow the performance of the power amplifier to be monitored such that the values stored in the look-up table could be amended if necessary.

The invention thus allows a number of different goals to be achieved, and by modifying the circuit elements a trade-off between these goals is possible to optimise amplification in any particular environment. The goals are to improve the linearity of the power amplifier, to improve the power efficiency of the power amplifier and to increase the momentary maximum output power of the power amplifier.

What is claimed is:

1. A power amplifier unit comprising:
   power amplifier means having an input arranged to receive a variable envelope input signal and circuitry for setting an operational point of the power amplifier means using a bias control signal on a second input;
   means for detecting the instant power level of the input variable envelope signal to generate a power level information signal;
   a look-up table which holds for a plurality of the power level information signals respective digital control settings each setting representing a digital bias value for controlling the power amplifier means; and
   a digital analogue converter for receiving the digital control settings from the look-up table and for generating for each digital value a corresponding analogue bias control signal arranged to be output to the second input to control the setting circuitry such that the operational point of the power amplifier varies in dependence on the instant power level of the variable envelope input signal to maintain a constant gain of the power amplifier.

2. A power amplifier unit according to claim 1, wherein the setting circuitry comprises gating circuitry responsive to the analogue bias control signal.

3. A power amplifier unit according to claim 1, wherein the bias control signal comprises a biasing voltage.

4. A power amplifier unit according to claim 1, wherein the setting circuitry comprises a FET responsive to a bias control voltage.

5. A transmission system for a mobile communications network comprising:

circuitry for generating an information signal representing data to be transmitted via the mobile communications network;

a mixer for combining said information signal with a carrier signal to generate a combined signal for transmission purposes, said combined signal having a variable power envelope;

a power amplifier for amplifying said combined signal to a power level adequate for transmission via an RF antenna; and circuitry for setting the operational point of the power amplifier responsive to the input power level of the variable envelope input signal such as to maintain a constant gain for the power amplifier wherein the circuitry for setting the operational point of the power amplifier comprises a look-up table which holds for a plurality of input power levels respective digital control settings, each setting representing a digital bias value for controlling the power amplifier.

6. A power amplifier unit according to claim 5, wherein the preamplifier is a numeric amplifier connected to receive the digital control settings from the look-up table.

7. A power amplifier unit according to claim 6, wherein the preamplifier is an analogue amplifier controllable in response to the analogue bias control signal generated by the digital to analogue converter.

8. A transmission system for a mobile communications network comprising:

means for generating an information signal representing data to be transmitted via the mobile communications network;

a mixer for combining said information signal with a carrier signal to generate a combined signal for transmission purposes, said combined signal having a variable power envelope;

a power amplifier for amplifying said combined signal to a power level adequate for transmission via an RF antenna; and means for setting the operational point of the power amplifier responsive to the input power level of the variable envelope input signal such as to maintain a constant gain for the power amplifier wherein the means for setting the operational point of the power amplifier comprises a look-up table which holds for a plurality of input power levels respective digital control settings, each setting representing a digital bias value controlling the power amplifier means.

9. A power amplifier unit comprising:

a power amplifier having an input arranged to receive a variable envelope input signal and circuitry for setting an operational point of the power amplifier using a bias control signal on a second input;

circuitry for detecting the instant input level of the power variable envelope signal to generate a power level information signal;

a look-up table which holds for a plurality of power level information signals respective digital control settings each setting representing a digital bias valued for controlling the power amplifier; and a digital to analogue converter for receiving the digital control settings from the look-up table and for generating for each digital value a corresponding analogue bias control signal arranged to be output to the second input to control the setting circuitry such that the operational point of the power amplifier varies in dependence on the instant power level of the variable envelope input signal to maintain a constant gain of the power amplifier.

\* \* \* \* \*